(12) United States Patent
Zhou (10) Patent No.: US 11,075,135 B2
(45) Date of Patent: Jul. 27, 2021

(54) SEMICONDUCTOR STRUCTURE AND METHOD OF FORMING A SEMICONDUCTOR STRUCTURE

(71) Applicants: Semiconductor Manufacturing International (Beijing) Corporation, Beijing (CN); Semiconductor Manufacturing International (Shanghai) Corporation, Shanghai (CN)

(72) Inventor: Fei Zhou, Shanghai (CN)

(73) Assignees: Semiconductor Manufacturing (Beijing) International Corporation, Beijing (CN); Semiconductor Manufacturing (Shanghai) International Corporation, Shanghai (CN)

( * ) Notice: Subject to any disclaimer, the term of this patent is extended or adjusted under 35 U.S.C. 154(b) by 77 days.

(21) Appl. No.: 16/601,896

(22) Filed: Oct. 15, 2019

(65) Prior Publication Data

US 2020/0161208 A1 May 21, 2020

(30) Foreign Application Priority Data

Nov. 16, 2018 (CN) .......................... 201811368089.1

(51) Int. Cl.
*H01L 29/66* (2006.01)
*H01L 29/78* (2006.01)
(Continued)

(52) U.S. Cl.
CPC .... *H01L 23/367* (2013.01); *H01L 21/823431* (2013.01); *H01L 21/823481* (2013.01);
(Continued)

(58) Field of Classification Search
CPC ............ H01L 29/66795; H01L 29/785; H01L 21/823431; H01L 21/823481; H01L 27/0886
See application file for complete search history.

(56) References Cited

U.S. PATENT DOCUMENTS

2020/0105612 A1\* 4/2020 Lin ................. H01L 21/823878

\* cited by examiner

*Primary Examiner* — Thanh Y. Tran
(74) *Attorney, Agent, or Firm* — Brinks Gilson & Lione (57) ABSTRACT

A semiconductor structure and a method for forming a semiconductor structure are disclosed. A form of a method for forming a semiconductor structure includes: providing a base; patterning the base, to form a substrate and fins protruding out of the substrate, where each fin includes a bottom fin and a top fin located on the bottom fin, and in a direction perpendicular to an extension direction of each fin, a width of the top fin is less than a width of the bottom fin; and forming an isolation structure on the substrate exposed by a fin, where the isolation structure covers at least a sidewall of the bottom fin, and a top of the isolation structure is lower than a top of the fin. In the present disclosure, a bottom fin with a larger width is formed, to increase the volume of the bottom fin, and the area of a contact surface of the fin and the substrate, and to correspondingly enhance an effect of dissipating heat generated during working of a device to the substrate, thereby improving the heat dissipation performance of the device, and to correspondingly improving a self-heating effect of the device, so that the device performance is further improved.

9 Claims, 5 Drawing Sheets

(51) Int. Cl.
  *H01L 21/8234* (2006.01)
  *H01L 27/088* (2006.01)
  *H01L 23/367* (2006.01)
  *H01L 23/34* (2006.01)
(52) U.S. Cl.
  CPC ........ *H01L 23/345* (2013.01); *H01L 27/0886* (2013.01); *H01L 29/66795* (2013.01); *H01L 29/785* (2013.01)

SEMICONDUCTOR STRUCTURE AND METHOD OF FORMING A SEMICONDUCTOR STRUCTURE

RELATED APPLICATIONS

The present application claims priority to Chinese Patent Appln. No. 201811368089.1, filed Nov. 16, 2018, the entire disclosure of which is hereby incorporated by reference.

BACKGROUND

Technical Field

Embodiments and implementations of the present disclosure relate to the field of semiconductor manufacturing, and in particular, to a semiconductor structure and a forming method thereof.

Related Art

In semiconductor manufacturing, with a development tendency of ultra-large-scale integrated circuits, a critical dimension (CD) of an integrated circuit is regularly being reduced. To adapt to the reduction of the CD, a corresponding channel length of a MOSFET is also regularly reduced. However, with the shortening of the channel length of a device, a corresponding distance between a source and a drain of the device is also shortened. Therefore, a control capability of a gate for a corresponding channel becomes worse, and it is increasingly difficult for a gate voltage to pinch off the channel, so that a subthreshold leakage phenomenon, that is, a so-called short-channel effect (SCE) occurs more easily.

SUMMARY

To better adapt to the reduction of the CD, a semiconductor process gradually begins a transition from a planar MOSFET to a three-dimensional transistor having higher efficacy, such as a fin field effect transistor (FinFET). In the FinFET, a gate structure may control an ultra thin body (fin) from at least two sides. Compared with the planar MOSFET, the gate structure has a stronger control capability for the channel, and can well suppress the short-channel effect; and compared with other devices, the FinFET can be better compatible with the existing integrated circuit manufacturing.

A problem to be addressed in embodiments and implementations of the present disclosure is to provide a semiconductor structure and a forming method thereof, to improve the device performance.

To address the foregoing problem, one form of the present disclosure provides a method for forming a semiconductor structure, including: providing a base; patterning the base, to form a substrate and fins protruding out of the substrate, where each fin includes a bottom fin and a top fin located on the bottom fin, and in a direction perpendicular to an extension direction of each fin, a width of the top fin is less than a width of the bottom fin; and forming an isolation structure on the substrate exposed by a fin, where the isolation structure covers at least a sidewall of the bottom fin, and a top of the isolation structure is lower than a top of the fin.

Another form of the present disclosure further provides a semiconductor structure, including: a substrate; fins protruding out of the substrate, where each fin includes a bottom fin and a top fin located on the bottom fin, and in a direction perpendicular to an extension direction of a fin, a width of the top fin is less than a width of the bottom fin; and an isolation structure, located on the substrate exposed by a fin, where the isolation structure covers at least a sidewall of the bottom fin, and a top of the isolation structure is lower than a top of the fin.

When compared with the prior art, technical solutions of embodiments and implementations of the present disclosure have one or more of the following advantages:

In some implementations, after a base is patterned, a formed fin includes a bottom fin and a top fin located on the bottom fin, and in a direction perpendicular to an extension direction of the fin, a width of the top fin is less than a width of the bottom fin; a bottom fin with a larger width is formed, to increase the volume of the bottom fin, and the area of a contact surface of the fin and a substrate, and to correspondingly enhance an effect of dissipating heat generated during working of a device to the substrate, thereby improving the heat dissipation performance of the device, and to correspondingly improve a self-heating effect of the device, so that the device performance is further improved.

In some implementations, after the top fin is formed, a sidewall layer is formed on a sidewall of the top fin, and second patterning processing is performed on the residual base exposed by the top fin by using the sidewall layer as a mask, to form the bottom fin. The sidewall layer is formed on the sidewall of the top fin, so that the width of the bottom fin can be easily controlled by controlling the thickness of the sidewall layer, to help reduce the process difficulty in forming the bottom fin, and improve the width accuracy of the bottom fin.

In some implementations, the base includes a device unit region, and the device unit region includes a central region and an edge region located on two sides of the central region. After the second patterning processing, a bottom fin of the central region is an integral structure, to further increase the volume of the bottom fin of the central region, and the area of a contact surface of a fin and a substrate of the central region, thereby further improving the self-heating effect of the device.

DETAILED DESCRIPTION

At present, after a fin structure is introduced to a semiconductor structure, the device performance is easily degraded. The cause of the performance degradation is as follows:

Compared with a planar transistor, a space occupied by an isolation structure in a FinFET is enlarged, and the area of a contact surface of a fin and a substrate is relatively small, thereby worsening a heat dissipation effect of a device. Further, the material of the isolation structure is generally silicon oxide, which has a smaller heat conductivity coefficient compared with the material of the substrate, thereby further worsening the heat dissipation effect of the device, and causing a more severe self-heating effect of the device, and correspondingly more severe performance degradation of the device.

To address the technical problem, in some implementations of the present disclosure, a formed fin includes a bottom fin and a top fin located on the bottom fin, where a width of the bottom fin is greater than a width of the top fin; a bottom fin with a larger width is formed to increase a volume of the bottom fin, and an area of a contact surface of the fin and a substrate, and correspondingly enhance an effect of dissipating heat generated during working of a device to the substrate, thereby improving the heat dissipation performance of the device, and correspondingly improving a self-heating effect of the device, so that the device performance is further improved.

To make the foregoing objectives, features, and advantages of embodiments and implementations of the present disclosure clearer and more comprehensible, the following describes specific embodiments and implementations of the present disclosure in detail with reference to the accompanying drawings.

FIG. 1 to FIG. 8 are schematic structural diagrams corresponding to steps in one form of a method for forming a semiconductor structure.

Figure 1:
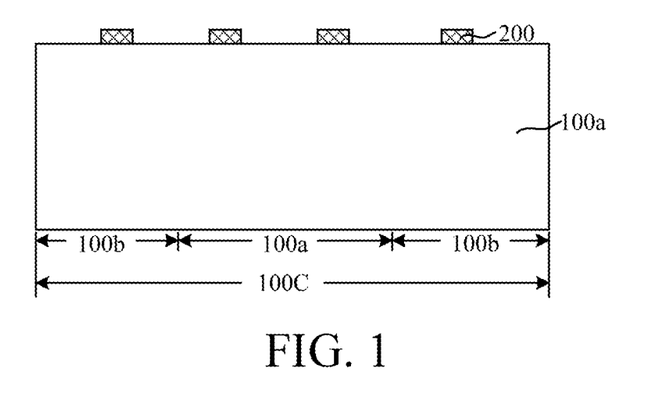
FIG. 1 to FIG. 8 are schematic structural diagrams corresponding to steps in one form of a method for forming a semiconductor structure.

Referring to FIG. 1, a base 100a is provided. The base 100a is used to provide a process foundation for subsequently forming a substrate and a fin. In some implementations, the base 100a is an integral structure.

In some implementations, a material of the base 100a is Si. However, in other implementations, the material of the base may be another material such as Ge, SiGe, SiC, GaAs, or InGa. The base may also be a base of another type, such as a Si base on an insulator or a Ge base on an insulator.

In other implementations, the base may be a lamination structure, and include a first semiconductor layer and a second semiconductor layer epitaxially growing on the first semiconductor layer. The first semiconductor layer is used as a substrate, and the second semiconductor layer is used to form a fin, thereby improving the height accuracy of the fin formed subsequently. Correspondingly, when the base is a lamination structure, the materials of the first semiconductor layer and the second semiconductor layer may also be different, to meet actual requirements.

In some implementations, the base 100a includes a device unit region 100C, and the device unit region 100C includes a central region 100a and an edge region 100b located on two sides of the central region 100a. After a substrate and fins protruding out of the substrate are subsequently formed, a plurality of fins is formed on a substrate of the device unit region 100C (for example: the plurality of fins is arranged as a matrix, or the plurality of fins is arranged along a direction perpendicular to an extension direction). Correspondingly, after an isolation structure is formed, neighboring device unit regions 100C are separated from each other using the isolation structure, and a spacing between the neighboring device unit regions 100C is generally greater than a spacing between neighboring fins.

In some implementations, the edge region 100b is used to form at least one fin, and the central region 100a is used to form a plurality of fins. Specifically, based on the quantity of the fins formed on the substrate of the device unit region 100C, positions of the edge region 100b and the central region 100a, and the quantity of the fins subsequently formed on the edge region 100b and the central region 100a respectively are properly set.

In some implementations, a patterned fin mask layer 200 is formed on the base 100a. The dimension and the shape of the fin mask layer 200 are determined based on the dimension and the shape of an effective fin subsequently. The effective fin refers to a part used as a channel in the fin, that is, a part exposed on an isolation structure and covered by a gate structure.

The material of the fin mask layer 200 is a hard mask (HM) material. The material of the fin mask layer 200 may be silicon nitride (SiN), silicon oxide ($SiO_2$), silicon oxynitride (SiON), SiOC, a-C, SiOCN, or a lamination of them. In some implementations, the material of the fin mask layer 200 is silicon nitride.

In some implementations, to adapt to the continuous reduction of a graphic critical dimension (CD), a self-aligned double patterning (SADP) process is used to form the mask layer 200. In other implementations, the mask layer may also be formed using other patterning manners, such as a self-aligned double double patterning (SADDP) process or a litho-etch-litho-etch (LELE) process, for example.

Figure 2:
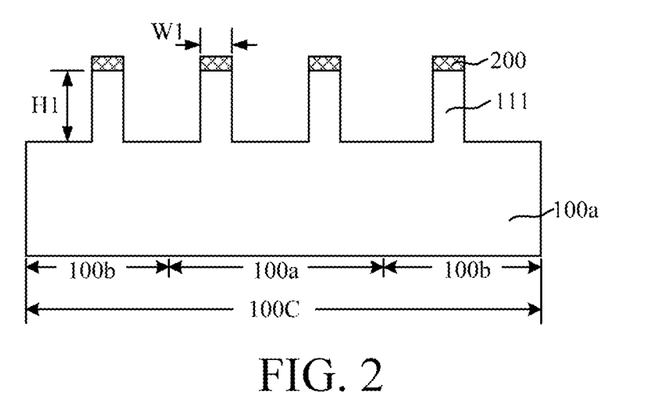
Figure 4:
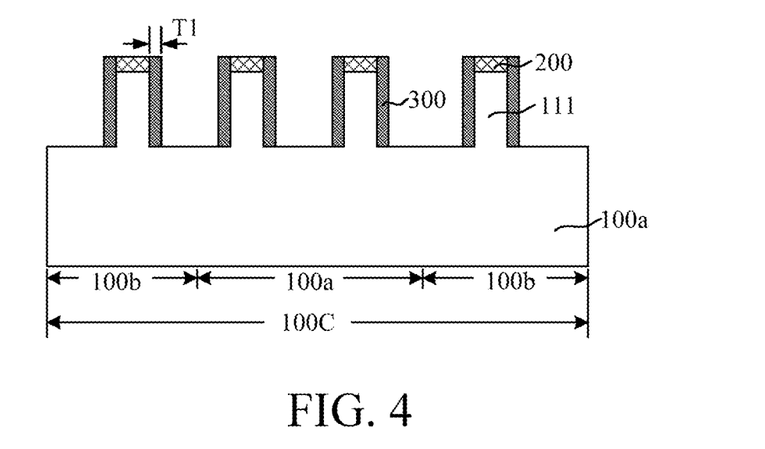
Figure 5:
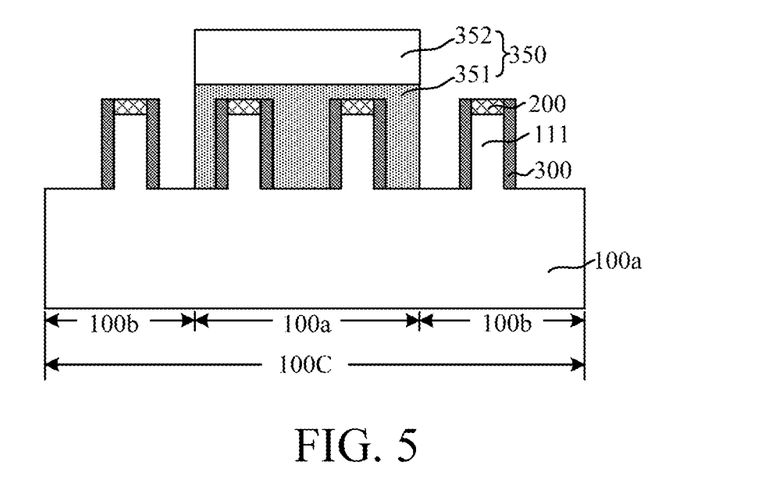
Figure 6:
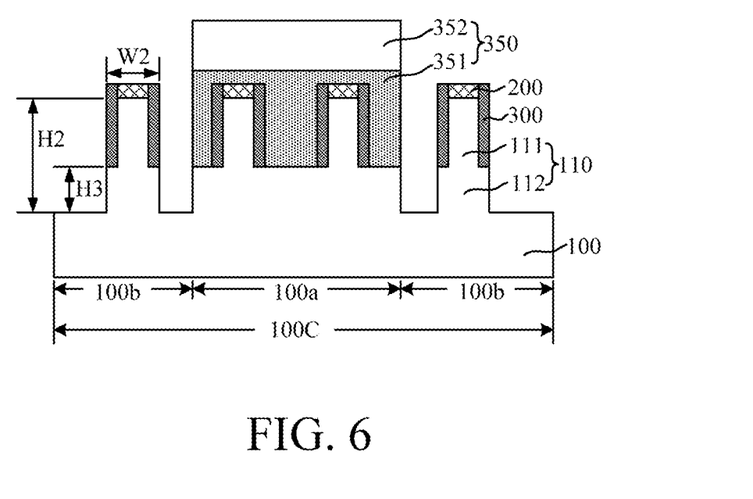
Figure 7:
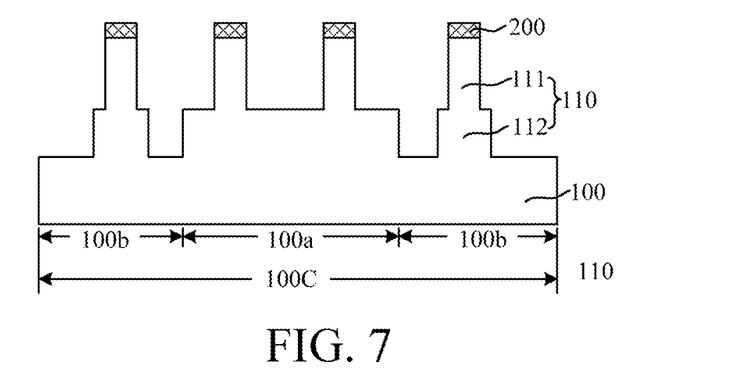

Referring to FIG. 2 to FIG. 7, the base 100a (as shown in FIG. 1) is patterned, to form a substrate 100 (as shown in FIG. 7) and fins 110 (as shown in FIG. 7) protruding out of the substrate 100, where the fin 110 includes a bottom fin 112 (as shown in FIG. 7) and a top fin 111 (as shown in FIG. 7) located on the bottom fin 112. In a direction perpendicular to an extension direction of the fin 110, the width W1 (as shown in FIG. 2) of the top fin 111 is less than the width W2 (as shown in FIG. 6) of the bottom fin 112.

A bottom fin 112 with a larger width is formed to increase the volume of the bottom fin 112, and the area of a contact surface of the fin 110 and the substrate 100, and to correspondingly enhance an effect of dissipating heat generated during working of a device to the substrate 100, thereby improving a self-heating effect of the device, so that the device performance is improved.

In some implementations, the fin 110 is in a stair-step shape, that is, both the bottom fin 112 and the top fin 111 have a smooth sidewall, and in the direction perpendicular to the extension direction of the fin 110, a partial top surface of the bottom fin 112 is exposed on two sides of the top fin 111.

The fin 110 in a stair-step shape is formed to help reduce the process difficulty of a patterning process, and to improve the process operability. Further, the width W1 of the top fin 111 and the width W2 of the bottom fin 112 are easily controlled, thereby improving the dimension accuracy. Moreover, the fin 110 in a stair-step shape is axisymmetric along a normal direction of the substrate 100, and in a process of subsequently forming an isolation structure, a stress non-equilibrium problem can be avoided, thereby effectively reducing the probability that the top fin 111 is bended and deformed.

It should be noted that, to avoid the impact on the device performance, after an isolation structure is subsequently formed, the isolation structure covers at least a sidewall of the bottom fin 112, and a top fin 111 exposed on the isolation structure is used as an effective fin.

Therefore, a ratio of the height H1 (as shown in FIG. 2) of the top fin 111 to the height H2 (as shown in FIG. 6) of the fin 110 should not be excessively small or excessively large. If the ratio is excessively small, the height of the effective fin is easily caused to be excessively small, or the probability that the bottom fin 112 is exposed on the isolation structure subsequently is easily increased, thereby generating harmful impact on the device performance. If the ratio is excessively large, the height H3 (as shown in FIG. 6) of the bottom fin 112 is correspondingly excessively small, and an effect of improving the self-heating effect is easily reduced. Therefore, in some implementations, a ratio of the height H1 of the top fin 111 to the height H2 of the fin 110 is 0.3 to 0.6, for example, 0.35, 0.4, or 0.5.

Correspondingly, the height H2 of the fin 110 should not be excessively small or excessively large. If the height H2 of the fin 110 is excessively small, based on the foregoing ratio setting, and in a situation in which it is ensured that the height of the effective fin can meet the process requirements, the thickness of the isolation structure subsequently is easily caused to be excessively small, thereby easily reducing an isolation effect of the isolation structure, and further easily causing a problem of increasing a leakage current of the device. If the height H2 of the fin 110 is excessively large, the thickness of the substrate 100 is easily excessively small, and process risks are easily increased. Therefore, in some implementations, the height H2 of the fin 110 is 1000 Å to 2000 Å.

It should be further noted that, in a situation in which the bottom fin 112 and the top fin 111 are in a one-to-one correspondence, a difference between the width W2 of the bottom fin 112 and the width W1 of the top fin 111 should not be excessively small or excessively large. If the width difference is excessively small, the width W2 of the bottom fin 112 is easily caused to be excessively small, thereby easily reducing the effect of improving the self-heating effect. If the width difference is excessively large, a spacing between neighboring bottom fins 112 is easily excessively small, thereby reducing a filling effect of the material of the isolation structure subsequently between the neighboring bottom fins 112, further easily reducing the isolation effect of the isolation structure, and easily causing a problem of increasing the leakage current of the device. Therefore, in this embodiment, in a situation in which the bottom fin 112 and the top fin 111 are in a one-to-one correspondence, the width difference between the bottom fin 112 and the top fin 111 is 20 Å to 80 Å, for example, 30 Å, 50 Å, or 70 Å.

In some implementations, the step of patterning the base 100a includes the following steps.

Referring to FIG. 2, first patterning processing is performed on the base 100a, and a protruded top fin 111 is formed on the residual base 100a. The first patterning processing is used to etch the base 100a of a partial thickness, to form the top fin 111, thereby providing a process foundation for subsequently forming a bottom fin.

The height H1 of the top fin 111 is determined based on the height H2 (as shown in FIG. 6) of the subsequently formed fin 110 (as shown in FIG. 6), and a height ratio of the top fin 111 to the fin 110. In some implementations, based on actual situations, the height H1 of the top fin 111 is 350 Å to 800 Å.

The top fin 111 subsequently exposed on the isolation structure is used as an effective fin. Therefore, in a direction perpendicular to an extension direction of the top fin 111, the width W1 of the top fin 111 is determined based on an actual process requirement.

Specifically, the step of the first patterning processing includes: performing first etching processing on the base 100a using the fin mask layer 200 as a mask.

In some implementations, the process of the first etching processing is a dry etching process. The dry etching process has an anisotropic etching property and can obtain a relatively good etching profile. Therefore, the dry etching process is used to help improve the shape quality and the dimension precision of the sidewall of the top fin 111.

In some implementations, the material of the base 100a is Si, and an etching gas of the dry etching process is correspondingly a mixed gas of $Cl_2$, $O_2$, and HBr.

It should be noted that, to improve the etching efficiency and the shape quality of the top fin 111, and based on the setting of the height H1 of the top fin 111, suitable process parameters need to be selected. In some implementations, in the step of the first patterning processing, parameters of the dry etching process include: the process pressure is 5 mTorr to 150 mTorr, the electric power is 200 W to 500 W, and the etching time is 50 s to 600 s.

It should be further noted that, after the top fin 111 is formed, the fin mask layer 200 is reserved. The fin mask layer 200 is used to have a protective effect on a top of the top fin 111 in a subsequent process.

Figure 3:
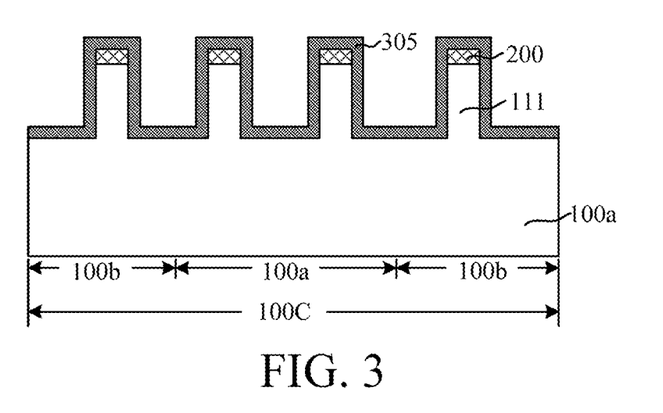

Referring to FIG. 3 and FIG. 4, a sidewall layer 300 (as shown in FIG. 4) is formed on the sidewall of the top fin 111. The sidewall layer 300 covers the surface of the residual base 100a of a partial region on the two sides of the top fin 111, and is used to have a mask effect in the process of subsequently patterning the residual base 100a to form the bottom fin, so that the width of the formed bottom fin is greater than the width W1 (as shown in FIG. 2) of the top fin 111.

Moreover, using the manner of forming the sidewall layer 300, the width of the bottom fin is easily controlled subsequently using the manner of controlling the thickness T1 (as shown in FIG. 4) of the sidewall layer 300, to help reduce the process difficulty in subsequently forming the bottom fin, and easily control the width of the bottom fin.

In addition, the sidewall layer 300 is formed on two sidewalls of the top fin 111, so that the formed fin is axisymmetric along a normal direction of the substrate 100, to further help simplify process steps of forming the sidewall layer 300, and reduce the process time.

The material of the sidewall layer 300 may be silicon oxide, silicon nitride, or silicon oxynitride. The foregoing materials are common dielectric materials in a semiconductor process, the forming process is relatively simple, the process compatibility is relatively high, and the process of subsequently removing the sidewall layer 300 has less damage to the residual base 100a, the top fin 111, and the bottom fin formed subsequently.

It should be noted that, an etching rate of the process of subsequently removing the sidewall layer 300 for the sidewall layer 300 is greater than an etching rate of the fin mask layer 200, thereby reducing losses affected by the fin mask layer 200 in the process of removing the sidewall layer 300, so that the fin mask layer 200 can still have a due effect in the subsequent process.

In some implementations, the material of the fin mask layer 200 is silicon nitride, and the material of the sidewall layer 300 is correspondingly silicon oxide. An etching selection ratio between silicon oxide and silicon nitride is relatively high, and the probability that the mask layer 200 is damaged subsequently can be reduced obviously.

The thickness T1 (as shown in FIG. 4) of the sidewall layer 300 is determined based on the width difference between the bottom fin and the top fin 111 subsequently. In some implementations, the width difference is 20 Å to 80 Å, and the thickness T1 of the sidewall layer 300 is correspondingly 10 Å to 40 Å, for example, 15 Å, 25 Å, or 35 Å.

Specifically, the step of forming the sidewall layer 300 includes: forming a sidewall film 305 (as shown in FIG. 3) conformally covering the residual base 100a and the top fin 111, removing the sidewall film 305 on the residual base 100a and the top fin 111 using a maskless dry etching process, and reserving the residual sidewall film 305 on the sidewall of the top fin 111 as the sidewall layer 300.

In some implementations, the sidewall film 305 is formed by using an atomic layer deposition process. The atomic layer deposition process has a relatively good step coverage capability, and the thickness T1 of the sidewall layer 300 is relatively small. The atomic layer deposition process is used to help improve the thickness precision and the thickness uniformity of the sidewall layer 300.

In other implementations, the sidewall film may also be formed by using a chemical vapor deposition process (for example: a furnace tube process).

Referring to FIG. 5 to FIG. 7, by using the sidewall layer 300 as a mask, second patterning processing is performed on the residual base 100a exposed by the top fin 111, the residual base 100a obtained after the second patterning processing is used as the substrate 100 (as shown in FIG. 6), a protrusion located on a surface of the substrate 100 is used as a bottom fin 112 (as shown in FIG. 6), the bottom fin 112 is connected to the top fin 111, and the bottom fin 112 and the top fin 111 are used to form a fin 110 (as shown in FIG. 6).

In the process of the second patterning processing, the residual base 100a covered by the sidewall layer 300 is reserved, so that the width W2 (as shown in FIG. 6) of the bottom fin 112 is greater than the width W1 (as shown in FIG. 2) of the top fin 111.

The height H3 (as shown in FIG. 6) of the bottom fin 112 is determined based on the height H2 (as shown in FIG. 6) of the fin 110, and the height ratio of the top fin 111 to the fin 110, that is, based on the height H2 of the fin 110 and the height H1 (as shown in FIG. 2) of the top fin 111.

In some implementations, based on actual situations, the height H3 of the bottom fin 112 is 400 Å to 1500 Å.

Specifically, the step of the second patterning processing includes: performing second etching processing on the residual base 100a by using the mask layer 200 and the sidewall layer 300 as masks.

In some implementations, the process of the second etching processing is a dry etching process. The dry etching process has an anisotropic etching property and can obtain a relatively good etching profile. Therefore, the dry etching process is used to help improve the shape quality and the dimension precision of the sidewall of the bottom fin 112.

In some implementations, the material of the base 100a is Si, and an etching gas of the dry etching process is correspondingly a mixed gas of $Cl_2$, $O_2$, and HBr.

It should be noted that, to improve the etching efficiency, the shape quality of the bottom fin 112, and based on the setting of the height H3 of the bottom fin 112, suitable process parameters are selected. In some implementations, in the step of the second patterning processing, parameters of the dry etching process include: the process pressure is 5 mTorr to 150 mTorr, the electric power is 200 W to 500 W, and the etching time is 50 s to 600 s.

As will be appreciated from the foregoing analysis, the height ratio of the top fin 111 to the fin 110 is 0.3 to 0.6. Therefore, in an actual process, based on process requirements, process parameters of the second patterning processing are appropriately adjusted. For example: when the height ratio is less than 0.5, compared with the first patterning processing, the etching time of the second patterning processing may be appropriately reduced, and other parameters may be appropriately adjusted, to obtain a preferred etching effect.

It should be further noted that, the fin mask layer 200 is formed on the top of the top fin 111, and in the process of the second patterning processing, the fin mask layer 200 has a protective effect on the top of the top fin 111, thereby preventing the second patterning processing from causing losses to the top fin 111, and further avoiding the impact on the height H1 of the top fin 111.

In addition, in some implementations, after the bottom fin 112 is formed, the fin mask layer 200 is reserved. In a subsequent flattening process, the surface of the fin mask layer 200 can be used to define a stopping position of the flattening process, and the fin mask layer 200 can further have a protective effect on the top of the fin 110.

Correspondingly, referring to FIG. 7, after the fin 110 is formed, the sidewall layer 300 is removed. The sidewall layer 300 is removed to expose the fin 110, thereby providing a process foundation for subsequently forming an isolation structure and a gate structure.

In some implementations, the sidewall layer 300 is removed using a wet etching process. The wet etching process can be used to avoid plasma damage to the substrate 100 and the fin 110, to help improve the device performance.

Specifically, the material of the sidewall layer 300 is silicon oxide, and an etching solution used in the wet etching process is correspondingly an HF acid solution. Silicon oxide is easily removed using the wet etching process, and the process risk is relatively low.

In other implementations, to improve the etching efficiency, the sidewall layer may also be removed by using a dry etching process or a dry and wet combining process.

Still referring to FIG. 5, in some implementations, after the sidewall layer 300 is formed, and before the second patterning processing, the method further includes: forming a graphic layer 350 on the residual base 100a of the central region 100a, where the graphic layer 350 covers a top fin 111 of the central region 100a.

The graphic layer 350 is used to have a mask effect in the process of the second patterning processing.

In some implementations, the graphic layer 350 includes a bottom anti-reflective coating 351 covering the top fin 111, and a photoresist layer 352 located on the bottom anti-reflective coating 351.

The bottom anti-reflective coating 351 is used to reduce a reflection effect during exposure, to help improve the exposure uniformity, thereby improving the shape quality, the position accuracy, and the dimension accuracy of the photoresist layer 352.

The bottom anti-reflective coating 351 has a good filling property, can be well filled between neighboring top fins 111, and is used to provide a flat surface for a photoresist coating, thereby further improving the shape quality, the position accuracy, and the dimension accuracy of the photoresist layer 352.

Moreover, the bottom anti-reflective coating 351 covers the top fin 111, to prevent the photoresist layer 352 from being filled between the neighboring top fins 111, thereby further providing a good interface foundation for forming the photoresist layer 352.

In addition, the process of subsequently removing the bottom anti-reflective coating 351 is relatively simple, and the process risk is relatively low.

In other implementations, the graphic layer may also be a photoresist layer. In yet other implementations, the graphic layer may also be not formed.

Correspondingly, still referring to FIG. 6, in the step of the second patterning processing, the second etching processing is performed on the residual base 100a using the sidewall layer 300 and the graphic layer 350 as masks.

By using the graphic layer 350, after the second patterning processing, a bottom fin 112 of the central region 100a is an integral structure.

Compared with a device formed in the edge region 100b, a device formed in the central region 100a is more difficult in heat dissipation. Therefore, the bottom fin 112 of the central region 100a is made to be an integral structure, to further increase the volume of the bottom fin 112 of the central region 100a, and the area of a contact surface of the fin 110 and the substrate 110 of the central region 100a, thereby further improving a self-heating effect of the device.

In some implementations, the graphic layer 350 only covers the central region 100a. Therefore, after the second patterning processing, only the top fin 111 and the bottom fin 112 of the edge region 100b are in a one-to-one correspondence.

Correspondingly, in some implementations, after the fin 110 is formed, and before the sidewall layer 300 is removed, the method further includes removing the graphic layer 350.

The graphic layer 350 is first removed to expose a sidewall layer 300 of the central region 100a, thereby providing a process foundation for the step of removing the sidewall layer 300.

In some implementations, the graphic layer 350 includes a bottom anti-reflective coating 351, and a photoresist layer 352 located on the bottom anti-reflective coating 351. Therefore, the graphic layer 350 is removed by using an ashing process.

It should be noted that, the sidewall layer 300 is formed on the sidewall of the top fin 111. In the process of removing the graphic layer 350, the sidewall layer 300 is further used to have a protective effect on the sidewall of the top fin 111, thereby reducing losses caused to the top fin 111 by the process of removing the graphic layer 350, and further reducing the probability that the width W1 (as shown in FIG. 2) of the top fin 111 changes, to avoid the impact on the device performance.

Figure 8:
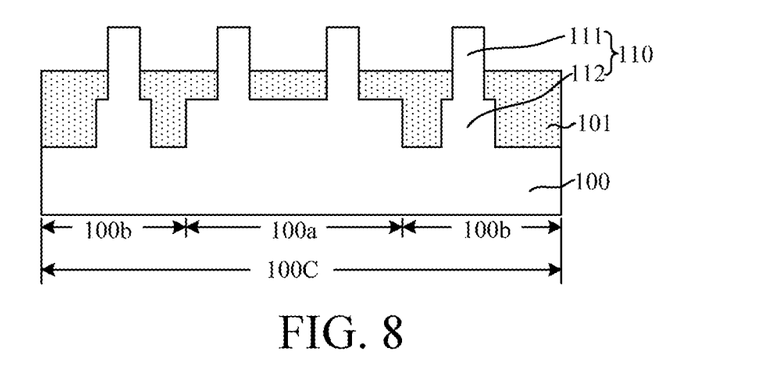

Referring to FIG. 8, after the sidewall layer 300 (as shown in FIG. 6) and the graphic layer 350 (as shown in FIG. 6) are removed, an isolation structure 101 is formed on the substrate 100 exposed by the fin 110, where the isolation structure 101 covers at least a sidewall of the bottom fin 112, and a top of the isolation structure 101 is lower than a top of the fin 110.

The isolation structure 101 is used to have an isolation effect on neighboring fins 110. In some implementations, the material of the isolation structure 101 is silicon oxide. In other implementations, the material of the isolation structure may also be another insulating material such as silicon nitride or silicon oxynitride.

Specifically, the step of forming the isolation structure 101 includes: forming an isolation material layer (not shown in the figure) on the substrate 100 exposed by the fin 110, where the isolation material layer covers a top of the mask layer 200 (as shown in FIG. 7); performing flattening processing on the isolation material layer using the top of the mask layer 200 as a stopping position; after the flattening processing, etching back an isolation material of a partial thickness, to reserve the residual isolation material as the isolation structure 101; and removing the mask layer 200 after forming the isolation structure 101.

In some implementations, the width W2 (as shown in FIG. 6) of the bottom fin 112 is greater than the width W1 (as shown in FIG. 2) of the top fin 111. Therefore, to avoid the impact of the bottom fin 112 on the normal performance of a device, the top of the isolation structure 101 is higher than the top of the bottom fin 112, that is, the isolation structure 101 further covers a partial sidewall of the top fin 111, so that the top fin 111 exposed on the isolation structure 101 is used as a channel for providing the device.

Moreover, the top fin 111 and the bottom fin 112 of the edge region 100b are in a one-to-one correspondence, so that the thickness of the isolation structure 101 of the edge region 100b is relatively large. Therefore, the isolation structure 101 still has a relatively good isolation effect, to further help reduce the probability of increasing a leakage current of the device.

FIG. 9 to FIG. 13 are schematic structural diagrams corresponding to steps in another form of method for forming a semiconductor structure.

Figure 12:
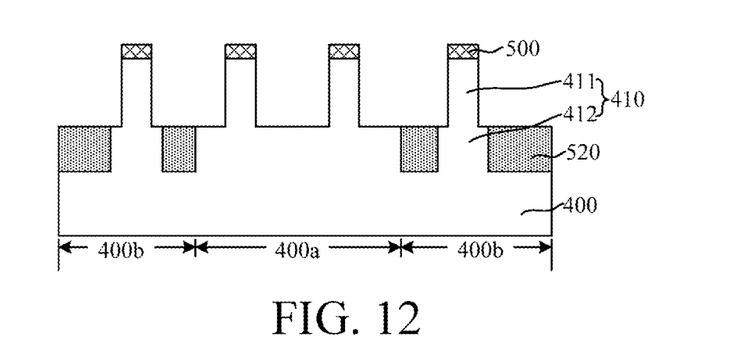

The similarity of this form of a method and the foregoing form of a method is not described herein again. The difference of between this form of a method and the foregoing form of a method lies in: The bottom fin 412 (as shown in FIG. 12) is first formed, and then the top fin 411 (as shown in FIG. 12) is formed.

Figure 9:
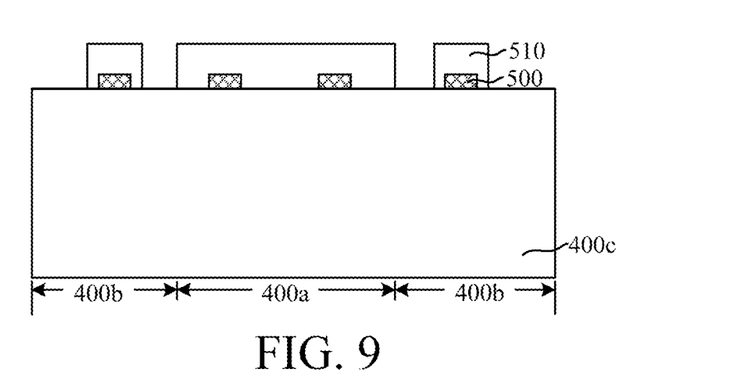
FIG. 9 to FIG. 13 are schematic structural diagrams corresponding to steps in another form of a method for forming method of a semiconductor structure.

In some implementations, the step of forming the bottom fin 412 and the top fin 411 includes:

Referring to FIG. 9, a patterned fin mask layer 500 is formed on a base 400c. A subsequently formed fin includes a bottom fin and a top fin protruding out of the bottom fin, and the fin mask layer 500 is used as an etching mask for first patterning processing subsequently, to define the width and the position of the top fin.

The manner of forming the fin mask layer 500 before patterning the base 400c reduces the process complexity of forming the fin mask layer 500.

For specific descriptions of the fin mask layer 500, reference may be made to the corresponding descriptions in the foregoing implementations. Details are not described herein again.

Still referring to FIG. 9, a graphic layer 510 is formed on the base 400c, and the graphic layer 510 further covers the fin mask layer 500.

The subsequently formed fin includes a bottom fin and a top fin protruding out of the bottom fin, and the graphic layer 510 is used as an etching mask for second patterning processing subsequently, to define the width and the position of the bottom fin.

In some implementations, to reduce the process complexity, the graphic layer 510 is a photoresist layer. In other implementations, the graphic layer may further include a bottom anti-reflective coating and a photoresist layer located on the bottom anti-reflective coating.

After the fin is formed subsequently, in a direction perpendicular to an extension direction of the fin, the width of the top fin is less than the width of the bottom fin. Therefore, after the graphic layer 510 is formed, the graphic layer 510 covers a top and a sidewall of the fin mask layer 500.

In some implementations, the base 400c includes a device unit region (not marked), and the device unit region includes a central region 400a and an edge region 400b located on two sides of the central region 400a. In the step of forming the graphic layer 510, the graphic layer 510 covers a base 400c of the central region 400a.

The graphic layer 510 is made to cover the entire central region 400a, so that the bottom fin subsequently formed in the central region 400a is an integral structure, to help further improve a self-heating effect of a device. In other implementations, graphic layers of the central region may also be separated from each other, and cover a corresponding fin mask layer.

Figure 10:
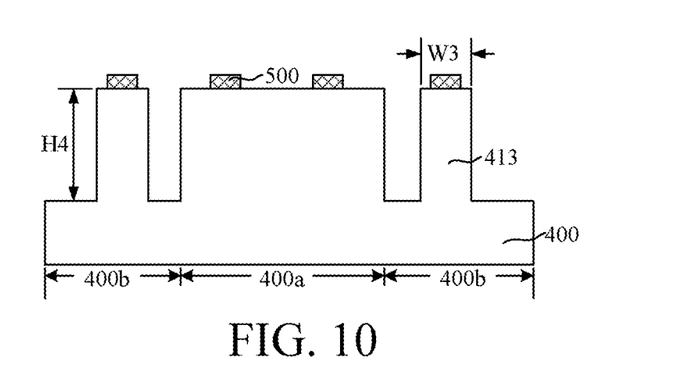

Referring to FIG. 10, the second patterning processing is performed on the base 400c (as shown in FIG. 9) using the graphic layer 510 (as shown in FIG. 9) as a mask, to form a substrate 400 (as shown in FIG. 10) and an initial fin 413 protruding out of the substrate 400.

In some implementations, the initial fin 413 of a partial height connected to the substrate 400 is used as a bottom fin, and the residual initial fin 413 is used to provide a process foundation for subsequently forming a top fin.

Therefore, in some implementations, the height H4 of the initial fin 413 is the height of a finally formed fin. Specifically, the height H4 of the initial fin 413 is 1000 Å to 2000 Å.

The initial fin 413 of a partial height connected to the substrate 400 is used to as a bottom fin. Therefore, the width W3 of the initial fin 413 is the width of a finally formed bottom fin.

In some implementations, the step of the second patterning processing includes: performing a dry etching process on the base 400c using the graphic layer 510 as a mask. The dry etching process is used to improve the shape quality and the dimension precision of the sidewall of the initial fin 413.

In some implementations, the material of the base 100a is Si, and an etching gas of the dry etching process is correspondingly a mixed gas of $Cl_2$, $O_2$, and HBr.

To improve the etching efficiency, the shape quality of the initial fin 413, and based on the setting of the height H4 of the initial fin 413, suitable process parameters are selected. In some implementations, in the step of the second patterning processing, parameters of the dry etching process include: the process pressure is 5 mTorr to 150 mTorr, the electric power is 200 W to 500 W, and the etching time is 50 s to 600 s.

It should be noted that, the graphic layer 510 covers the central region 400a. Therefore, the initial fin 413 of the central region 400a is an integral structure.

In some implementations, after the initial fin 413 is formed, the graphic layer 510 is removed. The graphic layer 510 is removed to expose the initial fin 413 and the fin mask layer 500, thereby making a process preparation for the first patterning processing performed subsequently. In some implementations, the graphic layer 510 is a photoresist layer. Therefore, the graphic layer 510 is removed using an ashing process.

In some implementations, after the graphic layer 510 is removed, a partial top of the initial fin 413 is exposed on two sides of the fin mask layer 500, thereby providing a process foundation for subsequently forming a top fin with a smaller width, so that the subsequently formed fin along a normal direction of the substrate is axisymmetric.

Figure 11:
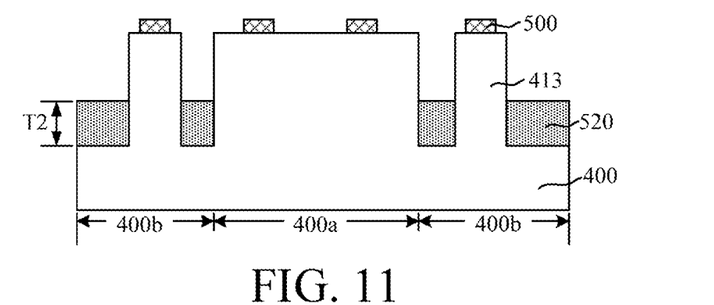

Referring to FIG. 11, after the graphic layer 510 (as shown in FIG. 9) is removed, a protection layer 520 is formed on the substrate 400 exposed by the initial fin 413, and the protection layer 520 covers a partial sidewall of the initial fin 413.

The protection layer 520 is used to have a protective effect on the substrate 400 in the process of the second patterning processing subsequently, to reduce the possibility that the substrate 400 is damaged, thereby avoiding the impact on the height of the fin subsequently.

In some implementations, the material of the protection layer 520 is a bottom anti-reflective coating material. The bottom anti-reflective coating material is used to help improve a filling effect of the protection layer 520 between neighboring initial fins 413. The bottom anti-reflective coating material is a material easily removed, to help reduce the impact of the process of subsequently removing the protection layer 520 on the formed fin and the substrate 400. In other implementations, the material of the protection layer may also be silicon oxide, silicon nitride, or silicon oxynitride.

Specifically, a coating process and an etching back process are combined, the protection layer 520 covers a partial sidewall of the initial fin 413.

It should be noted that, the thickness T2 of the protection layer 520 should not be excessively small or excessively large. If the thickness T2 is excessively small, the protective effect of the protection layer 520 is worsened correspondingly, and the probability that the substrate 400 is damaged in the process of the second patterning processing subsequently is relatively high. If the thickness T2 is excessively large, the difficulty in etching the initial fin 413 in the process of the second patterning processing is easily increased, thereby easily causing an excessively small height of the formed top fin, and further increasing the difficulty in subsequently removing the protection layer 520. Therefore, in this embodiment, the thickness T2 of the protection layer 520 is 500 Å to 900 Å.

In some implementations, to reduce the probability that a part used as the bottom fin in the initial fin 413 is etched, the thickness T2 of the protection layer 520 is equal to a preset height of the bottom fin. In other implementations, the thickness of the protection layer may also be less than the preset height of the bottom fin.

Referring to FIG. 12, first patterning processing is performed on the initial fin 413 of a partial height by using the fin mask layer 500 and the protection layer 520 as masks, where the residual initial fin 413 obtained after the first patterning processing is used as a bottom fin 412, a protrusion located on a surface of the bottom fin 412 is used as a top fin 411, the bottom fin 412 is connected to the top fin 411, and the bottom fin 412 and the top fin 411 are used to form a fin 410.

In the step of the first patterning processing, the initial fin 413 of a partial height exposed by the fin mask layer 500 is etched and removed, and the first patterning processing has an effect of reducing the width, so that the width of the bottom fin 412 is greater than the width of the top fin 411.

In some implementations, in a situation in which the bottom fin 412 and the top fin 411 are in a one-to-one correspondence, a difference between the width of the bottom fin 412 and the width of the top fin 411 is 20 Å to 80 Å.

In some implementations, a height ratio of the top fin 411 to the fin 110 is 0.3 to 0.6. Specifically, the height of the fin 410 is 1000 Å to 2000 Å, the height of the top fin 411 is 350 Å to 800 Å, and the height of the bottom fin 412 is correspondingly 400 Å to 1500 Å.

In some implementations, the process of the first patterning processing is a dry etching process, to improve the sidewall quality and the dimension precision of the top fin 411.

In some implementations, an etching gas of the dry etching process is a mixed gas of $Cl_2$, $O_2$, and HBr.

Specifically, in the step of the first patterning processing, parameters of the dry etching process include: the process pressure is 5 mTorr to 150 mTorr, the electric power is 200 W to 500 W, and the etching time is 50 s to 600 s. The height ratio of the top fin 411 to the fin 110 is 0.3 to 0.6. Therefore, in an actual process, based on process requirements, process parameters of the first patterning processing are appropriately adjusted. For example: compared with the second patterning processing, the etching time of the first patterning processing may be appropriately reduced, and other parameters may be appropriately adjusted, so that the height of the top fin 411 can meet the process requirements.

It should be noted that, the initial fin 413 of the central region 400a is an integral structure. Therefore, the bottom fin 412 of the central region 400a is also an integral structure.

Figure 13:
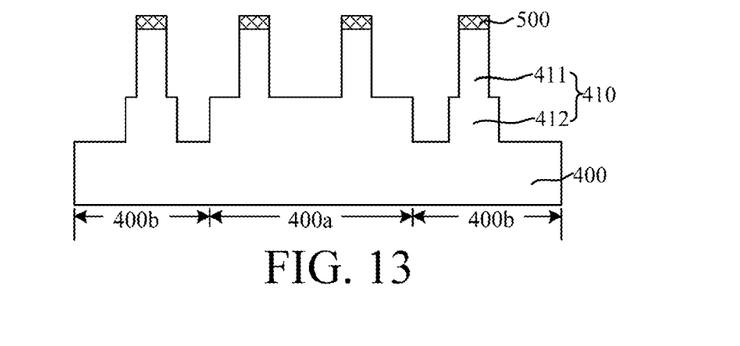

Referring to FIG. 13, after the fin 410 is formed, the protection layer 520 (as shown in FIG. 12) is removed.

The protection layer 520 is removed to provide a process foundation for subsequently forming an isolation structure and a gate structure.

In some implementations, the material of the protection layer 520 is a bottom anti-reflective coating material. Therefore, the protection layer 520 is removed using an ashing process.

For specific descriptions of subsequent steps, reference may be made to corresponding descriptions in the foregoing implementations. Details are not described herein again.

For specific descriptions of a method for forming a semiconductor structure of the current implementations, reference may be made to corresponding descriptions in the foregoing implementations. Details are not described herein again.

Implementations of the present disclosure further provides a semiconductor structure. FIG. 8 is a schematic structural diagram of one form of a semiconductor structure according to the present disclosure.

The semiconductor structure includes: a substrate 100; fins 110 protruding out of the substrate 100, where the fin 110 includes a bottom fin 112 and a top fin 111 located on the bottom fin 112, and in a direction perpendicular to an extension direction of the fin 110, the width W1 (as shown in FIG. 2) of the top fin 111 is less than the width W2 (as shown in FIG. 6) of the bottom fin 112. An isolation structure 101 is located on the substrate 100 exposed by the fin 110, the isolation structure 101 covers at least a sidewall of the bottom fin 112, and a top of the isolation structure 101 is lower than a top of the fin 110.

In some implementations, the material of the substrate 100 is Si. In other implementations, the material of the substrate may also be another material such as Ge, SiGe, SiC, GaAs, or InGa. The substrate may also be a substrate of another type, such as a Si substrate on an insulator or a Ge substrate on an insulator.

The fin 110 is used to provide a channel of a FinFET, and the material of the fin 110 is the same as the material of the substrate 100. In this embodiment, the fin 110 and the substrate 100 are an integral structure, and the material of the fin 110 is Si. In other implementations, the material of the fin may also be another material such as Ge, SiGe, SiC, GaAs, or InGa, and the material of the fin may also be different from the material of the substrate.

In some implementations, the substrate 100 includes a device unit region 100C, and the device unit region 100C includes a central region 100a and an edge region 100b located on two sides of the central region 100a. A plurality of top fins 111 is formed on the substrate 100 of the device unit region 100C (for example, the plurality of top fins 111 are arranged as a matrix, or the plurality of top fins 111 are arranged along a direction perpendicular to an extension direction), neighboring device unit regions 100C are separated from each other by using the isolation structure 101, and a spacing between the neighboring device unit regions 100C is generally greater than a spacing between neighboring top fins 111.

The quantity of top fins 111 of the edge region 100b is at least one, and the quantity of top fins 111 of the central region 100a is plural. Specifically, based on the quantity of the top fins 111 formed on the substrate 100 of the device unit region 100C, positions of the edge region 100b and the central region 100a, and the quantity of the top fins 111 formed on the edge region 100b and the central region 100a of the substrate 100 respectively are properly set.

In some implementations, the quantity of the top fins 111 of the edge region 100b is one. In other implementations, the quantity of the top fins of the edge region may also be plural.

In some implementations, in the direction perpendicular to the extension direction of the fin 110, the width W1 (as shown in FIG. 2) of the top fin 111 is less than the width W2 (as shown in FIG. 6) of the bottom fin 112.

A bottom fin 112 with a larger width dimension is formed, to increase the volume of the bottom fin 112, and the area of a contact surface of the fin 110 and the substrate 100, and correspondingly enhance an effect of dissipating heat generated during working of a device to the substrate 100, thereby improving the heat dissipation performance of the device, correspondingly improving a self-heating effect of the device, so that the device performance is further improved.

In some implementations, the fin 110 is in a stair-step shape, that is, both the bottom fin 112 and the top fin 111 have a smooth sidewall, and in the direction perpendicular to the extension direction of the fin 110, a partial top surface of the bottom fin 112 is exposed on two sides of the top fin 111, and the fin 110 is axisymmetric along a normal direction of the substrate 100.

The partial top surface of the bottom fin 112 is made to be exposed on two sides of the top fin 111, so that in the process of forming the fin 110, the process difficulty in forming the fin 110 can be reduced, and the process implementability can be improved. Further, the width W2 of the bottom fin 112 can be easily controlled, to help improve the dimension accuracy of the fin 110. Moreover, the fin 110 is axisymmetric along the normal direction of the substrate 100, and in the process of forming the isolation structure 101, a stress non-equilibrium problem can be avoided, thereby effectively reducing the probability that the top fin 111 is bended and deformed.

In some implementations, the top fin 111 exposed on the isolation structure 101 is used as an effective fin. The effective fin refers to: a part used as a channel in the fin 110, that is, a part exposed on the isolation structure 101 and covered by the gate structure.

Therefore, in the direction perpendicular to the extension direction of the fin 110, the width W1 (as shown in FIG. 2) of the top fin 111 is determined based on an actual process requirement.

It should be noted that, a ratio of the height H1 (as shown in FIG. 2) of the top fin 111 to the height H2 (as shown in FIG. 6) of the fin 110 should not be excessively small or excessively large. If the ratio is excessively small, the height of the effective fin is easily caused to be excessively small, or the probability that the bottom fin 112 is exposed on the isolation structure 101 subsequently is easily increased, thereby generating harmful impact on the device performance. If the ratio is excessively large, the height H3 (as shown in FIG. 6) of the bottom fin 112 is correspondingly excessively small, and an effect of improving the self-heating effect is easily reduced. Therefore, in some implementations, a ratio of the height H1 of the top fin 111 to the height H2 of the fin 110 is 0.3 to 0.6, for example, 0.35, 0.4, or 0.5.

Correspondingly, the height H2 of the fin 110 should not be excessively small or excessively large. If the height H2 of the fin 110 is excessively small, in a situation in which the ratio of the height H1 of the top fin 111 to the height H2 of the fin 110 and the height of the effective fin can meet the process requirements, the thickness of the subsequent isolation structure 101 is easily caused to be excessively small, thereby easily reducing an isolation effect of the isolation structure 101, and further easily causing a problem of increasing a leakage current of the device. If the height H2 of the fin 110 is excessively large, the thickness of the substrate 100 is easily excessively small, and process risks are easily increased. Therefore, in some implementations, the height H2 of the fin 110 is 1000 Å to 2000 Å.

In some implementations, based on actual process requirements, the height H1 of the top fin 111 is 350 Å to 800 Å, and the height H3 of the bottom fin 112 is 400 Å to 1500 Å.

It should be further noted that, in a situation in which the bottom fin 112 and the top fin 111 are in a one-to-one correspondence, a difference between the width W2 of the bottom fin 112 and the width W1 of the top fin 111 should not be excessively small or excessively large. If the width difference is excessively small, the width W2 of the bottom fin 112 is easily caused to be excessively small, thereby easily reducing the effect of improving the self-heating effect. If the width difference is excessively large, a spacing between neighboring bottom fins 1121 is easily excessively small, thereby reducing a filling effect of the material of the isolation structure 101 between the neighboring bottom fins 112, further easily reducing the isolation effect of the isolation structure 101, and easily causing a problem of increasing the leakage current of the device. Therefore, in some implementations, the difference between width W2 of the bottom fin 112 and the width W1 of the top fin 111 is 20 Å to 80 Å, for example, 30 Å, 50 Å, or 70 Å.

Specifically, a partial top surface of the bottom fin 112 is exposed on two sides of the top fin 111. Therefore, in a situation in which the bottom fin 112 and the top fin 111 are in a one-to-one correspondence, the width of the bottom fin 112 exposed by the top fin 111 is 10 Å to 40 Å.

In some implementations, the quantity of top fins 111 of the edge region 100b is at least one, the quantity of top fins 111 of the central region 100a is plural, and a bottom fin 112 of the central region 100a is an integral structure.

Compared with a device formed in the edge region 100b, a device formed in the central region 100a is more difficult in heat dissipation. Therefore, the bottom fin 112 of the central region 100a is made to be an integral structure, to further increase the volume of the bottom fin 112 of the central region 100a, and the area of a contact surface of the fin 110 and the substrate 110 of the central region 100a, thereby further improving a self-heating effect of the device.

In some implementations, along an arrangement direction of the fin 110, a top fin 111 is formed on a substrate 100 of the edge region 100b, and the top fin 111 and the bottom fin 112 are in a one-to-one correspondence. In other implementations, based on the quantity of the top fins of the unit device region, a plurality of top fins may also be formed on the substrate of the edge region.

The isolation structure 101 is used to have an isolation effect on neighboring fins 110. In some implementations, the material of the isolation structure 101 is silicon oxide. In other implementations, the material of the isolation structure may also be another insulating material such as silicon nitride or silicon oxynitride.

In some implementations, the top of the isolation structure 101 is higher than the top of the bottom fin 112, that is, the isolation structure 101 further covers a partial sidewall of the top fin 111, thereby preventing the bottom fin 112 from being used to form a device, and further avoiding harmful impact of the bottom fin 112 on electrical properties of the device.

In some implementations, the top fin 111 and the bottom fin 112 of the edge region 100b are in a one-to-one correspondence, so that the thickness of the isolation structure 101 of the edge region 100b is relatively large. Therefore, the isolation structure 101 still has a relatively good isolation effect, to further help reduce the probability of increasing a leakage current of the device.

In some implementations, the semiconductor structure may be formed using the forming method in the foregoing embodiments and implementations, or may be formed by using another forming method. For specific descriptions of the semiconductor structure of the currently-described implementations, reference may be made to corresponding descriptions in the foregoing implementations. Details are not described herein again in this embodiment.

Although the present disclosure is disclosed as above, the present disclosure is not limited thereto. Various variations and modifications may be made by any person skilled in the art without departing from the spirit and scope of the present disclosure. Therefore, the protection scope of the present disclosure shall be subject to the scope limited by the claims.

What is claimed is:

1. A method for forming a semiconductor structure, comprising:
   patterning a base, to form a substrate and fins protruding out of the substrate, wherein each fin comprises a bottom fin and a top fin located on the bottom fin, and in a direction perpendicular to an extension direction of each fin, a width of the top fin is less than a width of the bottom fin; and
   forming an isolation structure on the substrate exposed by a fin, wherein the isolation structure covers at least a sidewall of the bottom fin, and a top of the isolation structure is lower than a top of the fin;
   wherein the step of patterning the base comprises:
      forming a patterned fin mask layer on the base;
      forming a graphic layer on the base, wherein the graphic layer further covers the fin mask layer;
      performing second patterning processing on the base by using the graphic layer as a mask, to form a substrate and an initial fin protruding out of the substrate;
      removing the graphic layer after the initial fin is formed;
      after the graphic layer is removed, forming a protection layer on the substrate exposed by the initial fin, wherein the protection layer covers a part of a sidewall of the initial fin;
      performing first patterning processing on the initial fin of a partial height using the fin mask layer and the protection layer as masks, wherein the residual initial fin obtained after the first patterning processing is used as the bottom fin, a protrusion located on a surface of the bottom fin is used as the top fin, the bottom fin is connected to the top fin, and the bottom fin and the top fin are used to form the fin; and
      removing the protection layer after the fin is formed.

2. The method of claim 1, wherein in the step of providing a base, the base comprises a device unit region, the device unit region comprises a central region and an edge region located on two sides of the central region, the edge region is used to form at least one fin, and the central region is used to form a plurality of fins; and
   in the step of forming the graphic layer, the graphic layer covers the base of the central region.

3. The method of claim 2, wherein the graphic layer is a photoresist layer; or the graphic layer comprises a bottom anti-reflective coating, and a photoresist layer located on the bottom anti-reflective coating.

4. The method of claim 1, wherein the material of the protection layer is a bottom anti-reflective coating, silicon oxide, silicon nitride, or silicon oxynitride.

5. The method of claim 1, wherein the thickness of the protection layer is 500 Å to 900 Å.

6. The method of claim 1, wherein processes of both the first patterning processing and the second patterning processing are dry etching processes.

7. The method of claim 6, wherein an etching gas of the dry etching process is a mixed gas of $Cl_2$, $O_2$ and HBr, the process pressure is 5 mTorr to 150 mTorr, the electric power is 200 W to 500 W, and the etching time is 50 s to 600 s.

8. The method of claim 1, wherein the bottom fin and the top fin are in a one-to-one correspondence, and a difference between the width of the bottom fin and the width of the top fin is 20 Å to 80 Å.

9. The method of claim 1, wherein a ratio of the height of the top fin to the height of the fin is 0.3 to 0.6.

* * * * *